United States Patent [19]
Avery et al.

[11] Patent Number: 6,002,290
[45] Date of Patent: Dec. 14, 1999

[54] CRISSCROSS VOLTAGE LEVEL SHIFTER

[75] Inventors: Leslie Ronald Avery, Flemington, N.J.; Peter D. Gardner, Bensalem, Pa.

[73] Assignees: Sarnoff Corporation, Princeton, N.J.; Sharp Corporation, Osaka, Japan

[21] Appl. No.: 08/997,270

[22] Filed: Dec. 23, 1997

[51] Int. Cl.⁶ .................................................. H03L 5/00
[52] U.S. Cl. ............................ 327/333; 327/52; 327/65; 326/62
[58] Field of Search .............................. 327/333, 51, 52, 327/65; 330/252, 253, 255, 262, 263, 264; 326/62, 68, 83, 27

[56] References Cited

U.S. PATENT DOCUMENTS

| | | | |
|---|---|---|---|
| 5,245,228 | 9/1993 | Harter | 326/68 |
| 5,399,928 | 3/1995 | Lin et al. | 327/434 |
| 5,406,141 | 4/1995 | Yero et al. | 326/68 |
| 5,539,334 | 7/1996 | Clapp, III et al. | 326/68 |
| 5,619,150 | 4/1997 | Briner | 327/55 |
| 5,650,971 | 7/1997 | Longway et al. | 365/207 |
| 5,698,993 | 12/1997 | Chow | 326/81 |
| 5,736,869 | 4/1998 | Wei | 356/81 |

*Primary Examiner*—Timothy P. Callahan
*Assistant Examiner*—An T. Luu
*Attorney, Agent, or Firm*—William J. Burke

[57] ABSTRACT

A crisscross level shifter comprising a pull-down circuit configured as a pair of cascode amplifiers and a crisscross pull-up circuit. The cascode amplifiers are enhanced by a feedforward circuit coupling, for both amplifiers, the input of one cascode amplifier to the output of the other cascode amplifier.

11 Claims, 3 Drawing Sheets

CRISSCROSS VOLTAGE LEVEL SHIFTER

The invention relates to voltage level shifter circuits and, more particularly, the invention relates to a high speed, low power voltage level shifter circuit.

BACKGROUND OF THE DISCLOSURE

With the introduction of CMOS circuits with geometries below 0.35 microns, lower power supply voltages have become necessary to maintain device reliability. Consequently, supply voltage have decreased from 5 volts to 3.3 volts or less. However, many interface (bus) signals still use zero to 5 volt logic levels. Logic processor input/output (I/O) circuits therefore are required to be "voltage friendly", i.e., they may provide (source) a zero to 3.3 volt signal but must accept a zero to 5 volt signal.

In lieu of being voltage friendly, the circuitry can be divided into "core" circuits and I/O circuits, where the "core" logic operates at the lower 3.3 volts, and the I/O circuits operate at 5 volts. To facilitate signal level compatibility, a voltage level shifter circuit similar to FIG. 1 (Prior Art) is used within the I/O circuits.

Furthermore, the introduction of very high speed, small geometry SIMOX CMOS circuits (where each transistor is electrically isolated by silicon dioxide) enables even lower voltages for the 'core' circuits. Many of these circuits are required to operate from a single battery in such applications as pagers). Other applications use a single battery (0.8 to 1.5 volts) to power the core circuits and a double battery (1.5 to 3 volts) to power the I/O circuits. A flexible core to I/O voltage level shifter is required that can accept 0.8 volt logic signals as an input and translate to either 0.8 volts or 0.8 to 3 volts output signals. The large voltage spread may result from the core battery being low (end of life) and the I/O battery(ies) being new). As shall be described below, as the battery or batteries are drained, the prior art level shifter circuitry becomes relatively slow.

Specifically, FIG. 1 depicts a schematic diagram of a prior art level shifter 100 comprising a P-type crisscross pull-up circuit 102 and an N-type pull-down circuit 104. In response to an digital input signal $V_{in}$ the P-type circuit 102 pulls the output signal up to a predefined voltage (e.g., approximately VDDE) and, alternately, the N-type pull-down circuit 104 pulls the output voltage down to a predefined voltage (e.g., approximately zero).

More specifically, the input signal $V_{in}$ is coupled to two paths, where the first path carries the input signal to an inverter 106 and the second path carries the input signal directly to the gate electrode of transistor $N_2$ of the N-type pull-down circuit 104. The inverted output of the inverter 106 is coupled to the gate electrode of transistor $N_1$ of the N-type pull-down circuit 104. As such, each transistor of the N-type pull-down circuit 104 is driven with an input signal that is inverted with respect to the other input. To ensure timing synchronization a delay component may be used in the second path to transistor $N_2$ such that the input signal at each transistor is synchronized and "clock skew" is avoided.

The source electrode of each N-type transistor is connected to ground and the drain electrodes are coupled to the P-type pull-up circuit 102, i.e., the N-type transistors are arranged in a common source configuration. The P-type circuit is a crisscross design containing a pair of P-type transistors $P_1$ and $P_2$. The gate electrode of transistor $P_1$ is connected to the drain electrode of transistor $P_2$. Similarly, the gate electrode of transistor $P_2$ is connected to the drain electrode of transistor $P_1$. The source electrodes of each P-type transistor are coupled to a DC voltage supply VDDE.

In operation, in response to each transition of the input signal $V_{in}$, alternately, the P-type circuit 102 pulls the output signal up to approximately VDDE and the N-type circuit 104 pulls the output signal down to approximately ground. As such, the output signal switches between ground and VDDE with each cycle of the input signal.

In level shifters using such P-type crisscross circuits, the salient feature is the ability to consume minimal power during the transition times. For such level shifters to operate properly, the P-type transistors are "weak" compared to the N-type transistors, i.e., the p-type transistors have significantly lower drive current-capability so the N-type pull-down transistors can overcome the P-type pull-up function. Consequently, the output transitions suffer from relatively slow rise time as well as delay time for low-end voltage supply. This relative slowness is further exacerbated when the battery level at VDDE is low (e.g., decreases to 0.8 volts). In addition, the output signal also suffers from coupling effect gating through from the physically larger N-type pull-down transistors.

FIG. 2 depicts these detrimental characteristics of slow rise time and substantial delay in a plot of the output signal from the prior art level shifter of FIG. 1. The plot 200 depicts time (axis 202) versus output voltage magnitude (axis 204). The switching time delay is approximately 3 nanoseconds and the rise time can be as much as 6 nanoseconds. These data were taken using a 50 megahertz square wave input signal with VDDE fixed at 0.8 volts (simulating a battery with very low voltage) and a load capacitance of 0.1 picofarads. Such delay and rise time duration is well-known to result in excessive power consumption by the level shifter during the switching times.

Therefore, a need exists in the art for a crisscross level shifter having improved rise time, improved switching delay and low power consumption.

SUMMARY OF THE INVENTION

The disadvantages associated with the prior art are overcome by the present invention of a crisscross level shifter having an N-type circuit configured as a pair of cascode amplifiers and having feedforward transistors coupling the input of one cascode amplifier to the output of the other cascode amplifier.

Specifically, the invention comprises an inverter circuit, an N-type pull-down circuit, a P-type pull-up circuit, and a feedforward circuit. The inverter circuit converts the input signal $V_{in}$ into a pair of signals, an inverted signal and a non-inverted signal. The inverter circuit also ensures that the inverted and non-inverted signals remain synchronized, i.e., the signal transitions occur simultaneously at each input to the N-type circuit. The inverted signal is coupled to a first input of the N-type circuit and the non-inverted signal is coupled to a second input of the N-type circuit. The N-type circuit contains a pair of cascode amplifiers having the output of each amplifier coupled to the gate of one P-type transistor and drain of the other P-type transistors of the P-type circuit. Additionally, the invention uses a feedforward circuit to couple, for both cascode amplifiers, the input of one cascode amplifier to the output of the other cascode amplifier.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 3:
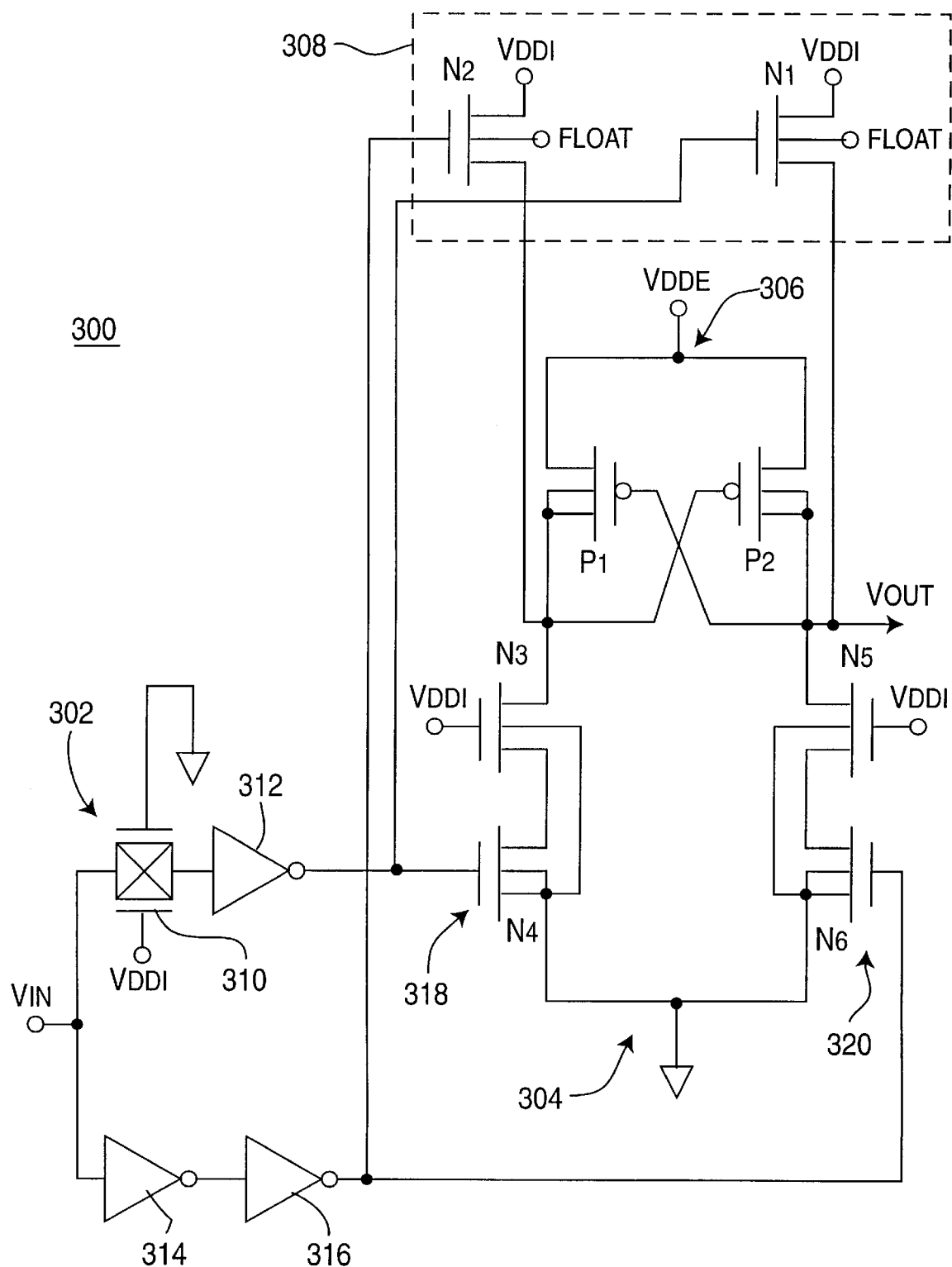
FIG. 3 depicts a schematic diagram of a crisscross level shifter of the present invention.

FIG. 3 depicts a schematic diagram of the crisscross voltage level shifter 300 of the present invention. The level shifter 300 contains an inverter circuit 302, an N-type pull-down circuit 304, a P-type pull-up circuit 306 and a feedforward circuit 308.

The inverter circuit divides the input signal $V_{in}$ into an inverted signal and a non-inverted signal. The inverted signal is produced by passing the input signal through a transmission gate 310 and an inverter 312. The non-inverted signal is produced by a pair of series connected inverters 314 and 316. The use of the transmission gate ensures that the inverted and non-inverted signals are synchronized i.e., the signal transitions occur simultaneously at each input to the N-type circuit. Such synchronization ensures that the input signal will not be skewed by the level shifting operation, i.e., so-called clock skew is avoided.

The N-type pull-down circuit 304 contains four N-type transistors $N_3$, $N_4$, $N_5$, and $N_6$, where transistors $N_3$ and $N_4$ form a first cascode amplifier 318 and transistors $N_5$ and $N_6$ form a second cascode amplifier 320. The first cascode amplifier has the inverted input signal coupled to the gate electrode of transistor $N_4$ and to the feed forward circuit 308. The source electrode of transistor $N_4$ is coupled to ground and the drain electrode is coupled to the source electrode of transistor $N_3$. The gate electrode of transistor $N_3$ is connected to a fixed DC voltage VDDI (e.g., approximately 0.8 volts to 1.5 volts) and the drain electrode of transistor $N_3$ is coupled to the P-type pull-up circuit 306 as well as the feedforward circuit 308. The bulk electrode of transistor $N_3$ is coupled to ground. This connection of the bulk electrode to ground reduces the leakage current of the cascade connected NMOS transistors compared to connecting the bulk electrode to the source of the "upper" transistor $N_3$.

The second cascode amplifier 320 has the non-inverted input signal coupled to the gate electrode of transistor $N_6$ and to the feed forward circuit 308. The source electrode of transistor $N_6$ is coupled to ground and the drain electrode is coupled to the source of transistor $N_5$. The gate of transistor $N_5$ is connected to a fixed DC voltage VDDI and the drain electrode of transistor $N_5$ is coupled to the P-type pull-up circuit 306 as well as the feedforward circuit 308. The bulk electrode of transistor $N_5$ is coupled to ground.

Figure 1:
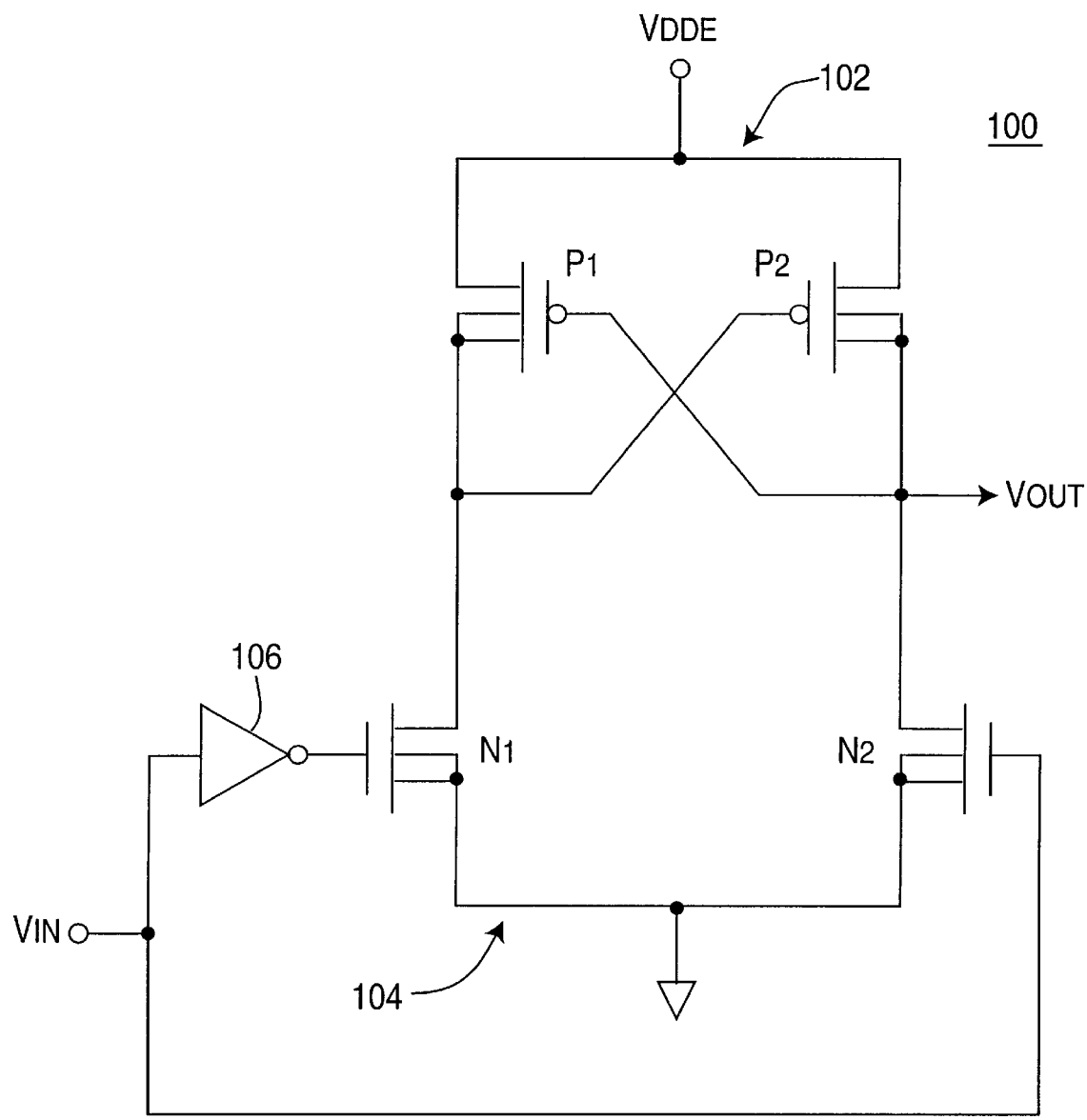
FIG. 1 depicts a schematic diagram of a prior art crisscross level shifter.
Figure 2:
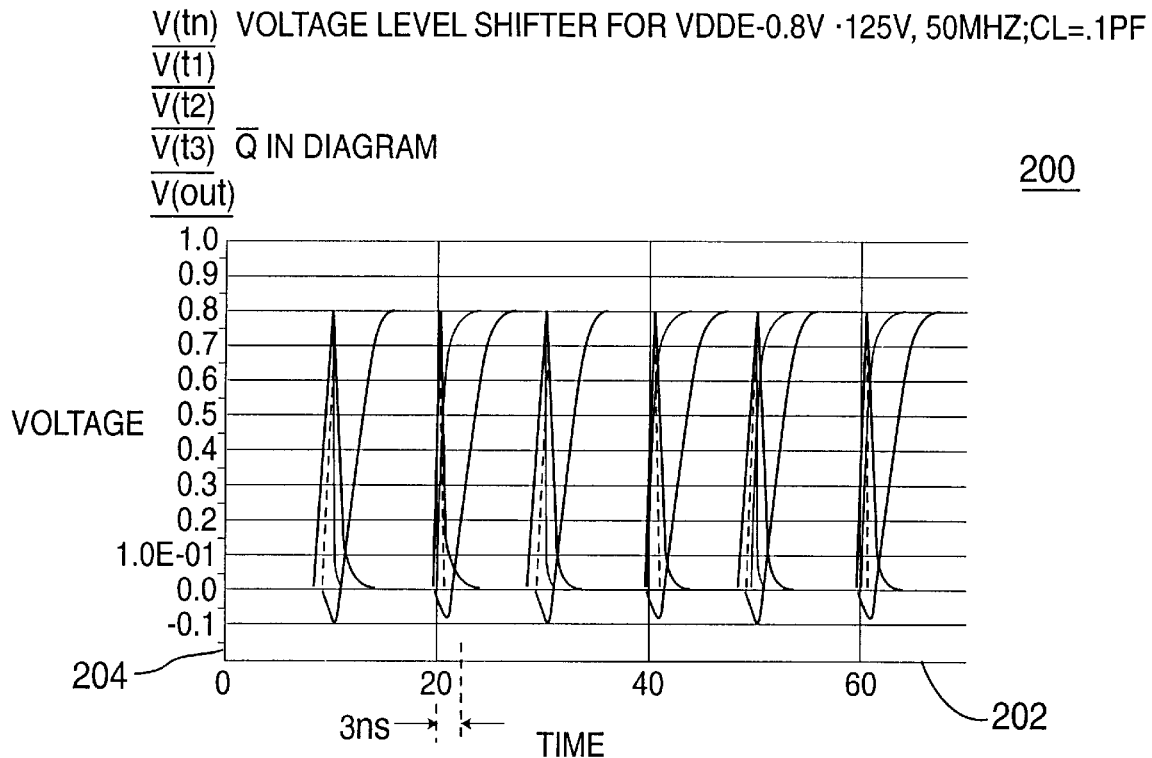
FIG. 2 depicts a plot of the output signal from a prior art crisscross level shifter.
Figure 4:
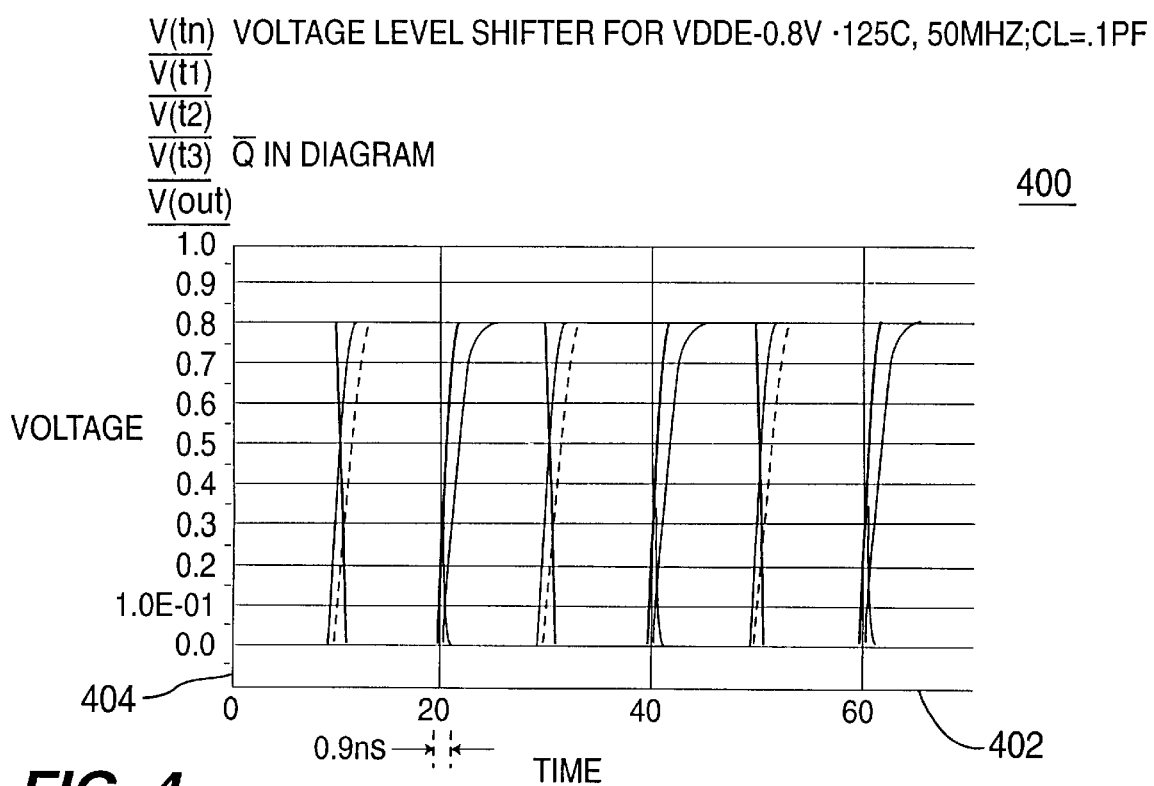
FIG. 4 depicts a plot of the output signal from the crisscross level shifter of the present invention.

The cascode amplifiers provide a low input impedance to transistors $N_4$ and $N_6$. Such a low input impedance reduces the Miller effect on transistors $N_4$ and $N_6$ to less than one gate capacitance. Consequently, the voltage coupling effect is substantially reduced as compared to the prior art to provide a substantially improved rise time of the output signal. FIG. 4 depicts a graph 400 of time (axis 402) versus voltage magnitude (axis 404) of the output signal from the level shifter 300. Importantly, the rise time of the output signal is approximately 3 nanoseconds as compared to approximately 6 nanoseconds of the prior art.

The P-type pull-up circuit 306 is a conventional crisscross design having a pair of P-type transistors $P_1$ and $P_2$. The gate electrode of transistor $P_1$ is connected to the drain electrode of transistor $P_2$. Similarly, the gate electrode of transistor $P_2$ is connected to the drain electrode of transistor $P_1$. The source electrodes of each P-type transistor is coupled to a voltage supply VDDE (e.g., approximately 0.8 volts to 3.6 volts). The drain electrode of transistor $P_1$ is connected to the drain electrode of N-type transistor $N_3$ as well as the feedforward circuit 308. Similarly, the drain electrode of transistor $P_2$ is connected to the drain electrode of N-type transistor $N_5$ as well as the feedforward circuit 308.

The cascode circuitry can be used to reduce loading and feedback capacitance without using the feed forward circuit 308; however, the overall performance of the level shifter is affected, e.g., the level shifter operates more slowly. Nonetheless, the invention should be interpreted as having preferred embodiment with a feed forward circuit and an alternative embodiment without a feed forward circuit.

In the preferred embodiment, the feedforward circuit 308 contains two N-type transistors $N_2$ and $N_1$. The drain electrodes of each of the transistors are coupled to the fixed voltage VDDI. The source of transistor $N_2$ is connected to the junction of the drains of transistor $N_3$ and transistor $P_1$. Similarly, the source of transistor $N_1$ is connected to the junction of the drain electrodes of transistor $N_5$ and transistor $P_2$. The gate electrode of feedforward transistor $N_2$ is coupled to the gate electrode of transistor $N_6$, i.e., the input to the second cascode amplifier 320. Also, the gate electrode of feedforward transistor $N_1$ is coupled to the gate electrode of transistor $N_4$, i.e., the input to the first cascode amplifier 318. The bulk electrode of the feedforward transistors is not connected to the source, i.e., it is floating.

In operation, cascode amplifiers 318 and 320 pull the output signal to ground and the P-type circuit pulls the output signal to approximately VDDE. The feedforward circuit enhances the response time of the cascode amplifiers such that the rise time of the output switching transitions is substantially improved over the prior art. Additionally, the switching speed of the cascode amplifiers using feedforward circuitry produces substantially improved switching delays. For example, FIG. 4 depicts a plot 400 of time (axis 402) versus output voltage magnitude (axis 404) showing a delay time of only 0.9 nanoseconds for switching between zero and 0.8 volts (low battery level condition) at 50 megahertz using a 0.1 picofarads load. This delay time is substantially improved over the 3 nanoseconds delay time of the prior art.

The proper operation of the crisscross level shifter depends upon the relative width ratio of P-type transistors to N-type transistors. Width and length are common terms for transistor width and channel length and the width/length ratio determines the current drive of a transistor for a given process. For a given channel length of the P-type transistors and N-type transistors, an acceptable range of width ratios for the P-type to N-type transistors is 1/10 to 1/2, with an optimum ratio of about 1/4. The optimum ratio provides the shortest propagation delay and minimum rise/fall times. In the embodiment of the invention used to provide the foregoing data, the P-type transistor has a 12 micron width and each N-type transistor is 100 microns wide. As such, for the same equivalent channel length, the N-type transistor width equates to 50 microns, hence a ratio of 12/50. The stated ratios are provided as an example of one embodiment of the invention and should not be considered to limit the invention in any way. In general, larger ratios lead to slower output rise times, but faster fall times; while smaller ratios lead to faster output rise times, but slower fall times. A ratio of 1/4 results in the rise and fall times being about equal, and overall, the shortest propagation delays for this circuit configuration.

By adding feedforward transistors $N_1$ and $N_2$, the level shifter has an improved transition time when transitioning from LOW to HIGH under various voltage VDDI and VDDE levels, i.e., the transition time is stable as the battery voltages vary for the core battery VDDI and the I/O battery VDDE. The feed forward transistors $N_1$ and $N_2$ operate in a source follower mode, and thus introduce less delay in the signal path compared to a inverting cascode/cross coupled latch. When VDDI and VDDE are the same potential, transistors $N_1$ and $N_2$ act as source followers until the potential between the gate and source drops below the threshold voltage of the transistors, i.e., the voltage on the source never exceeds the voltage on the drain. When VDDE is substantially higher than VDDI (e.g., a new I/O circuit battery and a drained core circuit battery), $N_1$ and $N_2$ act as source followers to speed up the initial transition (get the signal switching). When the source voltage rises sufficiently, transistor $N_1$ or $N_2$ turns off and the source voltage continues to rise due to the regenerative action of cross coupled transistors $P_1$, $P_2$. When the source voltage of transistor $N_1$ or $N_2$ exceeds VDDI, the source and drain terminals of transistor $N_1$ or $N_2$ reverse and the transistor is cut off.

Since the drain of transistor $N_1$, $N_2$ is connected to VDDI (1.5 v) and the source of $N_1$, $N_2$ is connected to a point which swings between zero and 3 volts, neither transistor experiences more than 1.5 volts between source and drain. This is important for the small geometry 'core' devices which tend to have a lower breakdown voltage.

The crisscross voltage level shifter of the present invention is fabricated in a dielectrically isolated silicon substrate which uses separation of the transistors from the bulk wafer by implantation of oxygen (i.e., SIMOX processing).

Although various embodiments which incorporate the teachings of the present invention have been shown and described in detail herein, those skilled in the art can readily devise many other varied embodiments that still incorporate these teachings.

What is claimed is:

1. A voltage level shifter comprising:
   a pull-down circuit having a first cascode amplifier and a second cascode amplifier, where an inverted signal is applied to an input of the first cascode amplifier and a non-inverted signal is applied to an input of the second cascode amplifier, for pulling down an output signal to a first predefined voltage level;
   a crisscross pull-up circuit, coupled to said pull-down circuit, for pulling up said output signal to a second predefined voltage level when said pull-down circuit is not pulling down said output signal to said first predefined voltage level; and
   a feedforward circuit, coupled to said pull-down circuit, for providing a feedforward signal to said output signal of said first and second cascode amplifiers that is derived from the input signals of said first and second cascode amplifiers, wherein said feedforward circuit comprises a first feedforward transistor coupled between the input of the first cascode amplifier and the output of the second cascode amplifier, and a second feedforward transistor coupled between the input of the second cascode amplifier and the output of the first cascode amplifier.

2. The voltage level shifter of claim 1 wherein said pull-up circuit comprises:
   a crisscross P-type circuit containing a first P-type transistor and a second P-type transistor.

3. The voltage level shifter of claim 1 wherein said first and second cascode amplifiers contain two N-type transistors.

4. The voltage level shifter of claim 1 wherein the first and second feedforward transistors operate in a source follower mode.

5. The voltage level shifter of claim 1 wherein said first cascode amplifier comprises a first transistor having a gate, a source, and a drain and a second transistor having a gate, a source and a drain, where said source of said first transistor is coupled to said first predefined voltage level, said gate of said first transistor is coupled to the inverted signal, the drain of the first transistor is connected to the source of the second transistor, the drain of the second transistor is connected to the crisscross pull-up circuit and the gate of the second transistor is coupled to a third predefined voltage level; and the second cascode amplifier comprises a third transistor having a gate, a source, and a drain and a fourth transistor having a gate, a source and a drain, where said source of said third transistor is coupled to ground, said gate of said third transistor is coupled to the non-inverted signal, the drain of the third transistor is connected to the source of the fourth transistor, the drain of the fourth transistor is connected to the crisscross pull-up circuit and the gate of the fourth transistor is coupled to said third predefined voltage level.

6. The voltage level shifter of claim 5 wherein said first feedforward transistor comprises a source, a drain, and a gate, where said gate of said first feedforward transistor is coupled to said inverted signal, said source of said first feedforward transistor is coupled to said drain of said fourth transistor, and said drain of said first feedforward transistor is coupled to said third predefined voltage level; and said second feedforward transistor comprises a sources, a drain, and a gate, where said gate of said second feedforward transistor is coupled to said non-inverted signal, said source of said second feedforward transistor is coupled to said drain of said second transistor, and said drain of said second feedforward transistor is coupled to said third predefined voltage level.

7. A voltage level shifter comprising:
   a pull-down circuit having a first cascode amplifier and a second cascode amplifier, where an inverted signal is applied to an input of the first cascode amplifier and a non-inverted signal is applied to an input of the second cascode amplifier, for pulling down an output signal to a first predefined voltage level;
   said first cascode amplifier comprises a first transistor having a gate, a source, and a drain and a second transistor having a gate, a source and a drain, where said source of said first transistor is coupled to said first predefined voltage level, said gate of said first transistor is coupled to said inverted signal, the drain of said first transistor is connected to the source of said second transistor, the drain of said second transistor is connected to a crisscross pull-up circuit and the gate of said second transistor is coupled to a predefined power supply having a third predefined voltage level;
   said second cascode amplifier comprises a third transistor having a gate, a source, and a drain and a fourth transistor having a gate, a source and a drain, where said source of said third transistor is coupled to said first predefined voltage level, said sate of said third transistor is coupled to said non-inverted signal, the drain of said third transistor is connected to the source of said fourth transistor, the drain of said fourth transistor is connected to said crisscross pull-up circuit and the gate of said fourth transistor is coupled to said predefined power supply having said third predefined voltage level;

said crisscross pull-up circuit, is coupled to said pull-down circuit, for pulling up an output signal to a second predefined voltage level when said pull-down circuit is not pulling down said output signal to said first predefined level; and a feedforward circuit, coupled to said pull-down circuit, for providing feedforward signals to said output of said first and second cascode amplifiers that are derived from the input signals of said first and second cascode amplifiers, wherein said feedforward circuit comprises a fifth transistor having a source, drain and gate, where said rate of said fifth transistor is coupled to the inverted signal, said source is coupled to said drain of said fourth transistor, and said drain is coupled to said third predefined voltage level; and a sixth transistor having a source, drain and gate, where said rate of said sixth transistor is coupled to said non-inverting signal, said source is connected to the drain of said second transistor, and said drain is coupled to said third predefined voltage level.

8. The voltage level shifter of claim 7 wherein said pull-up circuit comprises:

a crisscross P-type circuit containing a first P-type transistor and a second P-type transistor.

9. The voltage level shifter of claim 8 wherein said first, second, third, fourth, fifth, and sixth transistors are N-type transistors.

10. The voltage level shifter circuit of claim 7 wherein the fifth and sixth transistors act as voltage followers when the second predefined voltage level is less than or equal to the third predefined voltage level; when the second predefined voltage level, is higher than the third predefined voltage level, the fifth and sixth transistors increase the transistor speed of the crisscross pull-up circuit until the output voltage level of the first cascode circuit exceeds the voltage of the third predefined voltage level less a threshold voltage of the fifth and sixth transistors, at which time the source and drain of the fifth and sixth transistors are reversed and the fifth and sixth transistors are in inverse cutoff mode.

11. The voltage level shifter circuit of claim 10 wherein the operation of fifth and sixth transistors from source follower operation to inverse cutoff mode ensures that the gate to source/drain voltage and drain to source voltage is never exceeded.

\* \* \* \* \*